US008755414B2

(12) United States Patent
Claudon et al.

(10) Patent No.: US 8,755,414 B2
(45) Date of Patent: Jun. 17, 2014

(54) TERAHERTZ WAVE EMISSION LASER DEVICE

(75) Inventors: Julien Claudon, Saint Martin Le Vinoux (FR); Jean-Michel Gérard, Saint Martin d'Urlage (FR); Vincent Berger, Ivry-sur-Seine (FR); Giuseppe Leo, Fontanay sous Bois (FR); Alessio Andronico, Rome (IT)

(73) Assignees: Commissariat a l'energie atomique et aux energies alternatives, Paris (FR); Universite Paris Diderot—Paris 7, Paris Cedex (FR)

( * ) Notice: Subject to any disclaimer, the term of this patent is extended or adjusted under 35 U.S.C. 154(b) by 112 days.

(21) Appl. No.: 12/997,425

(22) PCT Filed: May 12, 2009

(86) PCT No.: PCT/FR2009/050872
§ 371 (c)(1),
(2), (4) Date: Mar. 18, 2011

(87) PCT Pub. No.: WO2009/150341
PCT Pub. Date: Dec. 17, 2009

(65) Prior Publication Data
US 2011/0188525 A1 Aug. 4, 2011

(30) Foreign Application Priority Data

Jun. 13, 2008 (FR) ...................................... 08 53939

(51) Int. Cl.
*H01S 5/10* (2006.01)
*H01S 1/02* (2006.01)
(52) U.S. Cl.
USPC ............................................................ 372/4
(58) Field of Classification Search
CPC ...... H01S 1/02; H01S 5/1075; H01S 2302/02
USPC ............................................................ 372/4
See application file for complete search history.

(56) References Cited

U.S. PATENT DOCUMENTS 5,790,583 A * 8/1998 Ho .................................. 372/92
6,541,295 B1 4/2003 Looney
(Continued)

OTHER PUBLICATIONS

International Search Report as issued for PCT/FR2009/050872, dated Nov. 17, 2009.
(Continued)

*Primary Examiner* — Tod T Van Roy
*Assistant Examiner* — Marcia Golub-Miller
(74) *Attorney, Agent, or Firm* — Pillsbury Winthrop Shaw Pittman LLP

(57) ABSTRACT

A laser device having a wave emission within a frequency range of 0.5 to 5 THz, includes a semiconductor heterostructure having a cylindrical form with a circular cross-section and including: a first optically nonlinear semiconductor material layer including an emitting medium configured to emit at least two optical whispering gallery modes belonging to the near-infrared spectrum, the two whispering gallery modes being confined within the first layer and enabling the generation, within the first layer, of radiation within an electromagnetic whispering gallery mode having a frequency of 0.5 to 5 THz, the radiation being obtained through the difference in frequency of the two whispering gallery modes, the cylindrical geometry of the heterostructure ensuring phase tuning between the two optical whispering gallery modes belonging to the near-infrared spectrum and the terahertz mode at the difference in frequency; a second and a third semiconductor material layer, each having an optical index weaker than the index of the material of the first layer and located on both sides of the first layer; at least one metal layer located on one end of the hetero structure.

24 Claims, 3 Drawing Sheets

(56) References Cited

U.S. PATENT DOCUMENTS

| | | | |
|---|---|---|---|
| 6,780,758 B1 * | 8/2004 | Derderian et al. | 438/630 |
| 7,031,365 B2 * | 4/2006 | Kneissl et al. | 372/94 |

OTHER PUBLICATIONS

G. Fasching et al. "Microcavity Terahertz Quantum-Cascade Laser"; Nov. 9, 2005, pp. 1-11, vol. 6010, No. 1.

C. Brenner et al. "Room Temperature Terahertz Generation with Semiconductor Lasers"; Proceedings of the SPIE; Jun. 19, 2006, pp. 3-4, paragraph 3, vol. 6194.

Y. Dumeige et al. "Second Harmonic Generation Using Tailored Whispering Gallery Modes"; Physical Review A (Atomic, Molecular, and Optical Physics) American Physical Society through AIP USA, Sep. 1, 2007, pp. 1-4, vol. 76, No. 3.

M. Tonouchi "Cutting-Edge Terahertz Technology"; Nature Photonics, Feb. 2007, p. 97.

M. Koch, "Terahertz Technology: A Land to be Discovered"; Optics and Photonics News, Mar. 2007, p. 21-25.

E.R. Brown et al. "Photomixing up to 3.8 THz in low-temperature-grown GaAs"; Appl. Phys. Lett. Jan. 16, 1995, pp. 285-287, 66, (3).

S. Verghese et al. "Generation and Detection of Coherent Terahertz Waves Using Two Photomixers"; Appi. Phys. Lett., Dec. 28, 1998, pp. 3824-3826, 73, (26).

R. Kohler et al. "Terahertz Semiconductor-Heterostructure Laser"; Nature, May 9, 2002, vol. 417, pp. 156-159.

R.L. Aggarwal et al. "Noncollinear Phase Matching in GaAs"; (Appl. Phys. Lett. 22, 339-340, Jan. 4, 1973.

K. H. Yang, et al."Generation of Far-Infrared Radiation by Picosecond Light Pulses in $LiNbO_3$" (Appl. Phys. Lett. 19, 320-323, (1971)).

Y. S. Lee et al. "Generation of Narrow-Band Terahertz Radiation via Optical Rectification of Femtosecond Pulses in Periodically Poled Lithium Niobate" (Appl. Phys. Lett. vol. 76, No. 18, pp. 2505-2507, May 1, 2000.

B. S. Williams et al. "Terahertz Quantum-Cascade Laser at $\lambda = 100$ μm Using Metal Waveguide for Mode Confinement" (Appl. Phys. Lett. vol. 83, No. 11, pp. 2124-2126, Sep. 15, 2003.

K. J. Franz et al. "Evidence of Cascaded Emission in a Dual-Wavelength Quantum Cascade Laser" (Appl. Phys. Lett. 90, 091104, Feb. 28, 2007.

K. L. Vodopyanov et al., "Terahertz-Wave Generation in Quasi-Phase-Matched GaAs"; Applied Physics Letter; 89, 141119; 2006.

V. Berger and C. Sirtori, "Nonlinear Phase Matching in THz Semiconductor Waveguides"; Semiconductor Science and Technology; 19; 2004; pp. 964-970.

Y. Dumogie and P. Féron "Whispering-Gallery-Mode Analysis of Phase-Matched Doubly Resonant Second-Harmonic Generation" ;Physical. Review A 74, 063804; pp. 063804-1-063804-7; 2006.

\* cited by examiner

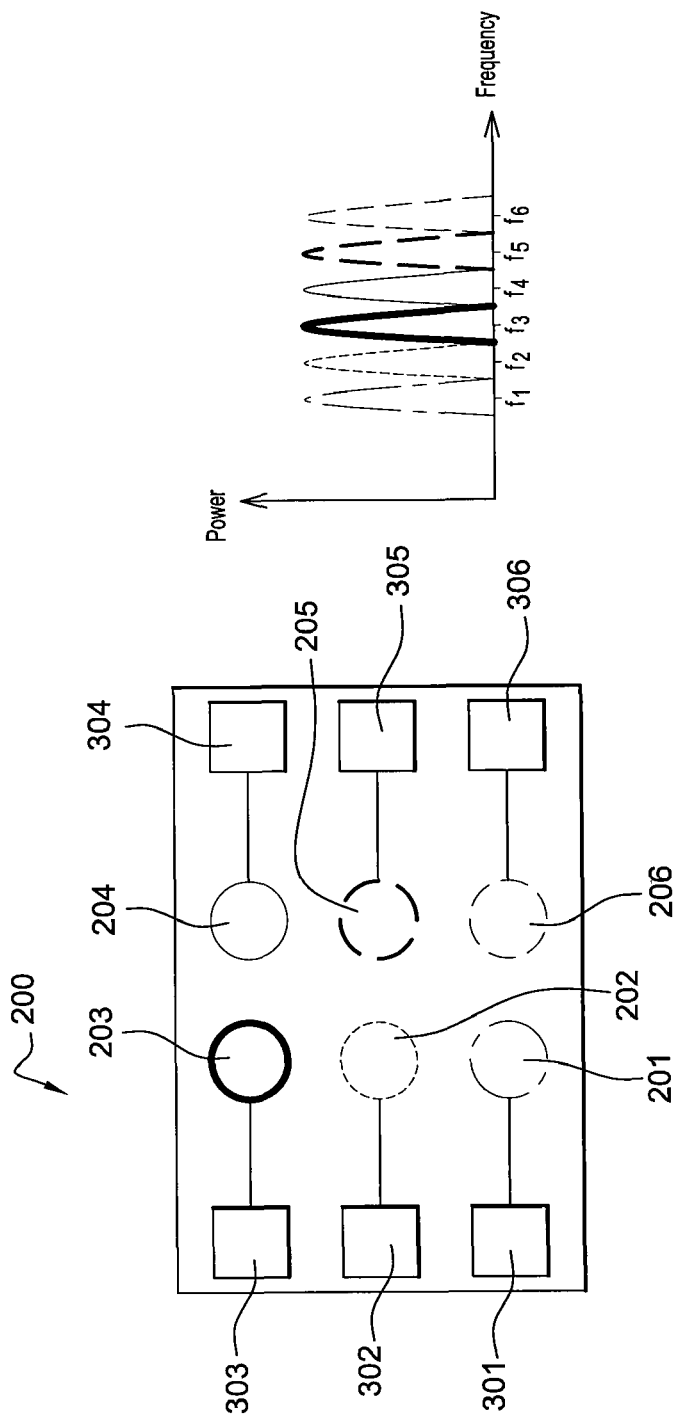

_US 8,755,414 B2_

TERAHERTZ WAVE EMISSION LASER DEVICE

CROSS-REFERENCE TO RELATED APPLICATIONS

This is the U.S. National Stage of PCT/FR2009/050872, filed May 12, 2009, which in turn claims priority to French patent application Ser. No. 08/53939, filed Jun. 13, 2008, the entire contents of all applications are incorporated herein by reference in their entireties.

The present invention relates to a laser device having wave emission within a frequency range of 0.5 to 5 THz.

The terahertz (THz) region of the electromagnetic spectrum lies between microwaves and far infrared and ranges from 500 GHz (0.5 THz) to 5 THz (1 THz typically corresponds to an energy of 4 meV or else to a vacuum wavelength of 300 μm).

THz sources are primarily used in spectroscopy and imaging within the fields of security and medicine. They can also be used for short-distance free-space telecommunications (for example inside buildings) for the non-destructive analysis of foodstuffs, top coats and integrated circuits. THz technology is described generally in the documents "Cutting-edge terahertz technology" (M. Tonouchi, Nature Photonics, February 2007, p. 97) and "Terahertz technology: a land to be discovered" (M. Koch, Optics and Photonics News, March 2007, p. 21).

Within the scope of THz spectroscopy, a distinction is generally made between broadband time domain spectroscopy (THz-TDS or THz time domain spectroscopy) and spectroscopy using a monochromatic THz source (CW or continuous wave). As a result of their intrinsically limited frequency resolution, TDS systems are used above all for the spectroscopy of structures with a weak quality factor. In fact, in accordance with typical experience of TDS, the time window is 100 ps with a frequency resolution of 5 GHz. On the other hand, continuous and monochromatic CW THz sources have found a vast field of application within astronomical spectroscopy or in the study of chemical reactions taking place in the upper atmosphere where generated THz resonances often have quality factors between $10^2$ and $10^6$.

THz spectroscopy also has a wide range of applications within civil and military security, for example in the detection of chemical or explosive agents. In all instances where the analysed product is in the gaseous phase, the spectra acquired by a CW method exhibit much higher resolution than the spectra obtained by a TDS method. TDS technology is predominantly used for characterisation of materials in condensed phase.

With regard to TDS sources, conventional THz radiation sources such as gas lasers or backward wave oscillators are expensive and bulky. THz sources based on solid oscillator assemblies are also expensive. Nowadays, the devices most often used to generate and detect broadband THz pulses are photoconductive dipole antennas excited by a femtosecond laser that is often expensive and large. Devices of this type are described in the document "Sensing with Terahertz Radiation" (D. Mittleman Springer-Verlag, Heidelberg (2003)).

Different sources of the CW type are also known.

A first known source of the CW monochromatic type uses the technique of photomixing: optical heterodyning makes it possible to generate a continuous THz wave. The beat of two continuous laser diodes emitting around 800 nm and detuned by a few THz leads to a load oscillation in the conduction band of a semiconductor, such as semi-insulating GaAs or InGaAs.

However, the models produced so far are non-integrated systems and the maximum THz powers generated remain relatively low, approximately 100 nW, as demonstrated by the documents "Photomixing up to 3.8 THz in low-temperature-grown GaAs" (E. R. Brown et al., Appl. Phys. Lett. 66, 285, (1995)) and "Generation and detection of coherent terahertz waves using two photomixers" (S. Verghese et al., Appl. Phys. Lett. 73, 3824 (1998)).

Quantum cascade lasers are a second type of monochromatic CW source within the THz range. Sources of this type are described in the document "Terahertz semiconductor-heterostructure laser", R. Kohler et al., Nature 417, 156 (2002). These sources make it possible to generate increased power, but are not tuneable and only function at cryogenic temperatures. For this last reason, these sources are bulky and complex systems.

A third known source of the CW type uses the technique of frequency conversion. The second-order nonlinear effects are thus used for THz generation and amplification by different approaches:

mixing mid-infrared lasers in bulk GaAs, as described in the document "Noncolinear phase matching in GaAs" (L. Aggarwal et al., Appl. Phys. Lett. 22, 239, (1973));

mixing ultrashort near-infrared pulses in crystals such as ZnSe and $LiNbO_3$, as described in the document "Generation of Far-Infrared Radiation by Picosecond Light Pulses in $LiNbO_3$" (K. H. Yang et al., Appl. Phys. Lett. 19, 320, (1971)), or periodically poled $LiNbO_3$ (PPLN or periodically poled lithium niobate), as described in the document "Generation of narrow-band terahertz radiation via optical rectification of femtosecond pulses in periodically poled lithium niobate" (Y.-S. Lee et al., Appl. Phys. Lett. 76, 2505 (2000)).

As a result of its high nonlinear coefficient and its low losses in the THz range (~1 $cm^{-1}$), GaAs is a material of choice for these applications. The document "Terahertz-wave generation in quasi-phase-matched GaAs" (K. L. Vodopyanov et al., Appl. Phys. Lett. 89, 141119, (2006)) describes the generation of THz waves from 0.9 to 3 THz in periodically poled GaAs, with a conversion efficacy of $10^{-3}$ using two pump beams close to 3 μm.

However, none of these systems are compact or easy to use outside a research laboratory.

The document "Nonlinear phase matching in THz semiconductor waveguides" (V. Berger and C. Sirtori, Semicond. Sci. Technol. 19, 964 (2004)) suggests utilising the abnormal dispersion created by absorption by the phonon band in GaAs in order to phase-tune two near-IR (infrared) pump beams and the THz beam generated in a ridge-type waveguide; this suggestion has not yet been experimented. In addition, similarly to the other solutions, it does not make it possible to obtain a compact system.

In view of this, the object of the present invention is to provide a compact laser device having light wave emission within a frequency range of 0.5 to 5 THz, making it possible to overcome the drawbacks mentioned above in terms of bulkiness, complexity and cost.

To this end, the invention proposes a laser device having wave emission within a frequency range of 0.5 to 5 THz comprising a semiconductor heterostructure, said device being characterised in that said heterostructure is cylindrical with a circular cross-section and comprises:

a first optically nonlinear semiconductor material layer including emitting means capable of emitting at least two optical whispering gallery modes belonging to the near-infrared spectrum, the at least two whispering gallery modes being confined within the first layer and enabling the generation, within the first layer, of radiation within an electromagnetic whispering gallery mode having a frequency of 0.5 to 5 THz, that is to say a 'terahertz' mode, the radiation being obtained through the difference in frequency of the two whispering gallery modes, the cylindrical geometry of said heterostructure ensuring phase tuning between the two optical whispering gallery modes belonging to the near-infrared spectrum and the terahertz mode at the difference in frequency;

a second and third semiconductor material layer, each having an optical index weaker than the index of the material used for the first layer and located on both sides of the first layer;

at least one metal layer located on one end of the heterostructure.

'Near-infrared' means radiation with a wavelength between 0.7 µm and 1.4 µm.

'Whispering gallery mode' means a mode resulting from the reflection of light rays over the inner cylindrical wall of the first layer forming a microcavity produced in a material of which the refractive index is greater than the medium surrounding it (i.e. air). The rays generally remain confined along the cylindrical wall and do not pass through the centre of the microcavity.

Thanks to the invention, the THz wave is generated by a difference in frequency (i.e. parametric conversion) from two whispering gallery modes belonging to the near-infrared spectrum and present in said first central layer forming a microcavity of the microcylinder type: reflection over the semiconductor-air interface of the microcylinder leads to the formation of THz whispering gallery modes. The whispering gallery modes with a very high quality factor are excited by emitters, such as quantum dots or wells. The emitters are preferably pumped electrically, but may also be pumped optically.

The device according to the invention enables continuous emission or quasi-continuous emission of THz electromagnetic radiation.

The cylindrical geometry of the invention with emitters inside the first cylindrical layer makes it possible to generate high THz powers within a compact source. The cylindrical symmetry of the first central layer made of an optically nonlinear semiconductor material, such as GaAs, promotes phase tuning between the optical whispering gallery modes and the THz mode.

The metal layer arranged on one end of the cylindrical heterostructure ensures the vertical confinement of the THz mode in accordance with the principle of metal plasmonic guides. This confinement makes it possible to increase the efficacy of the nonlinear conversion yield. The metal layer also enables injection of charge carriers in the case of electric pumping of the emitters.

The geometry according to the invention also makes it possible to simultaneously and independently optimise the vertical confinement of the optical whispering gallery modes and of the THz mode by manipulating the thicknesses of the different layers, in particular the thicknesses of the second and third layers made of a semiconductor material such as AlGaAs. This makes it possible to maximise recovery between the optical modes and the THz mode. It will be noted that the second and third layers not only make it possible to adjust the spacing between the mirror and the active layer comprising the emitters, but also to achieve lateral optical confinement of the THz mode.

As a result of the cylindrical shape without narrowing, the geometry according to the invention also offers good evacuation of heat toward the substrate, ensuring stability of the power of the properties of the laser and making it possible to reach laser powers compatible with nonlinear THz generation.

In accordance with a particularly advantageous mode of the invention, said cylindrical heterostructure comprises a central semi-insulating zone extending substantially between the two ends of said heterostructure.

This central zone makes it possible to improve the performance of the device according to the invention, if said device is pumped electrically, since the pumping current is effectively channelled in the active zone of the device, i.e. the circumference of the first active layer which supports near-infrared whispering gallery modes.

The device according to the invention may also exhibit one or more of the features below, considered individually or in any technically feasible combination:

said device according to the invention comprises two metal layers, each arranged on an end of said heterostructure;

said metal layer(s) is/are made of gold;

said emitting means are produced in one of the following forms:
 a quantum well or a plurality of quantum wells;
 a design or a plurality of designs of quantum dots;
 a quantum cascade structure or a plurality of quantum cascade structures;

said optically nonlinear semiconductor material of said first layer is a III-V material such as GaAs or InGaAsP or a II-VI material;

the semiconductor material of said second and third layers is $Al_xGa_{1-x}As$ with $0.2<x<0.6$ or InP;

said second semiconductor layer is a p-doped layer and said third semiconductor layer is a n-doped layer;

said first layer includes a plurality of emitter designs;

said cylindrical heterostructure comprises two semiconductor layers (layers protecting against oxidation) covering said second and third layers respectively;

each of said layers protecting against oxidation has a thickness between 2 and 10 nm;

the thickness of said second and third layers is between 0.5 and 5 µm;

the device according to the invention comprises two electrical contacts for injection of a pumping current of said emitting means;

the thickness of said first layer is between 200 and 400 nm;

the diameter of said cylindrical heterostructure is between 30 and 100 µm;

said first layer is a layer that is not intentionally doped.

The present invention also relates to a cryogenic system integrating a device according to the invention.

The present invention also relates to a network comprising a plurality of devices according to the invention, characterised in that each of said devices has substantially the same frequency.

In accordance with a first embodiment, said devices in the network are sufficiently close to one another to couple the THz evanescent fields of the different devices.

In accordance with a second embodiment, some of the THz radiation emitted by said network is reinjected into said network.

The present invention also relates to a network comprising a plurality of devices according to the invention, characterised in that each of said devices has a different THZ frequency, each of said devices being controlled individually.

Lastly, the present invention relates to a method for producing a device according to the invention, characterised in that said method comprises the following steps:

epitaxial growth by deposition on a semiconductor substrate of a structure comprising at least the following layers in this order from the substrate:
  a sacrificial semiconductor layer;
  a first protective semiconductor layer;
  a layer formed of a semiconductor material identical to that of said second layer;
  a layer formed of a semiconductor material identical to that of said first layer, said layer comprising emitting means;
  a layer formed of a semiconductor material identical to that of said third layer;
  a second protective semiconductor layer;
transfer to a previously metallised host substrate from said epitaxiated structure in such a way that the second protective layer is in contact with the metal of said host substrate;
thinning of said semiconductor substrate by mechanical abrasion;
selective chemical attack of said substrate over the remaining thickness, said sacrificial layer being used as a stop layer;
selective chemical attack of said sacrificial layer, said first protective layer being used as a stop layer;
production of a mask defining an opening with a diameter smaller than the diameter of the cylindrical heterostructure;
ionic implantation rendering the zone not protected by said mask semi-insulating;
elimination of said mask;
deposition of a circular metal layer with a diameter equal to the diameter of the cylindrical heterostructure;
etching of the portions not covered by said circular metal layer so as to form the cylindrical heterostructure.

Said mask advantageously defines an opening with a diameter smaller than the diameter of the cylindrical heterostructure by 1 to 2 µm.

Further features and advantages of the invention will become clearer upon reading the description given below by way of indication and non-limiting example with reference to the accompanying drawings, in which:

FIG. 3 is a schematic view of a network integrating a plurality of devices according to the invention and forming an agile frequency source.

Like components are denoted by like reference numerals in all the drawings.

FIG. 1a illustrates an embodiment of a laser device 1 according to the invention.

FIG. 1c is a sectional view along a vertical plane of said device 1.

Figure 1A:
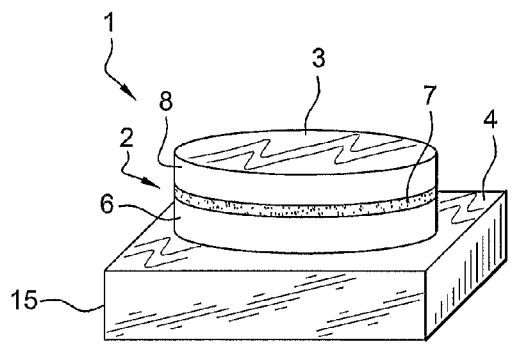
FIGS. 1a to 1c show an embodiment of a laser device according to the invention.

The device 1 according to the invention is a continuous or quasi-continuous source of THz electromagnetic rays. The generation of THz radiation is ensured by parametric conversion (i.e. frequency difference) from two optical modes of a whispering-gallery-mode semiconductor microlaser.

The device 1 thus comprises a cylindrical semiconductor heterostructure 2, of which the ends are each covered by a metal layer (for example made of gold) forming an upper mirror 3 and a lower mirror 4 respectively. The diameter of the cylindrical heterostructure 2 is typically between 30 and 100 µm.

Said semiconductor heterostructure 2 is arranged on a host substrate 15 which is a good electrical and thermal conductor, for example a metal substrate or a doped GaAs substrate.

Figure 1B:
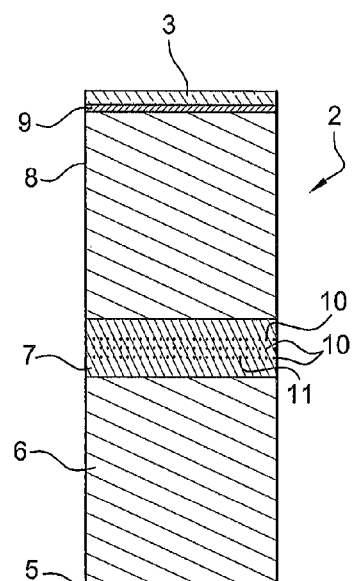

FIG. 1b shows the different layers of the cylindrical semiconductor heterostructure 2.

Said heterostructure 2 thus comprises, from bottom to top:
  the lower mirror 4;
  a thin layer 5 (a few nm, typically between 2 and 10 nm) of n-doped GaAs;
  a layer 6 of n-doped $Al_xGa_{1-x}As$ alloy (typically with $0.2<x<0.6$), of which the optical index is weaker than that of the GaAs and of which the thickness is, for example, between 0.5 and 5 µm, preferably between 0.5 and 3 µm;
  an active layer 7;
  a layer 8 of p-doped $Al_xGa_{1-x}As$ alloy (typically with $0.2<x<0.6$), of which the optical index is weaker than that of the GaAs and of which the thickness is, for example, between 0.5 and 5 µm, preferably between 0.5 and 3 µm;
  a thin layer 9 (a few nm, typically between 2 and 10 nm) of p-doped GaAs;
  the upper mirror 3.

Figure 1C:
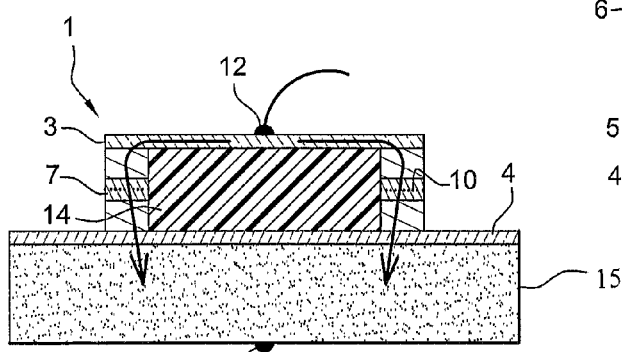

The active layer 7 is a layer of GaAs that is not intentionally doped and has a thickness typically between 200 and 400 nm (for example 300 nm). The layer 7 of GaAs also contains an emitting medium, in this instance a plurality of designs 10 of quantum dots 11: a single design of quantum dots may be sufficient and one or more quantum wells may also be used. In this instance the emitting medium is pumped electrically. Two electrical contacts 12 and 13 are provided for this purpose and are shown in FIG. 1c, which is a section along a vertical plane of the device 1 as shown in FIG. 1a. In this instance the contact 12 is formed on the upper mirror 3, which thus also acts as an upper injection electrode. The contact 13 is formed in the rear face of the host substrate (it will be seen from the description of the production method that other contact configurations may also be envisaged). The electrically pumped emitting medium naturally implies adequate doping of the semiconductor heterostructure 2. As described above, the lower $Al_xGa_{1-x}As$ layer 6 and the thin GaAs layer 5 in contact with the lower mirror 4 are thus n-doped whilst the upper $Al_xGa_{1-x}As$ layer 8 and the thin GaAs layer 9 in contact with the upper mirror 3 are p-doped.

It will be noted that the thin layers 5 and 9 are only illustrated in FIG. 1b for reasons of simplification of FIGS. 1a and 1c.

The emitting medium 10 provides the gain necessary to simultaneously produce a laser from a plurality of optical whispering gallery modes in the near-infrared spectrum. As already mentioned above, 'near-infrared' means radiation with a wavelength between 0.7 µm and 1.4 µm, and 'optical whispering gallery mode' means a mode resulting from the reflection of light rays on the inner wall of the GaAs layer 7 forming a cylindrical microcavity. The rays remain confined along the wall and do not pass through the centre of the microcavity. The THz mode is generated by a difference in frequency from the two whispering gallery modes. The difficulty in achieving parametric generation is linked to the need for what is known by the person skilled in the art as 'phase tuning': as a result of the dispersion of the optical index with the wavelength, the different waves that interact (near-IR optical modes and the THz mode) do not move at the same speed within the material. This means that the nonlinear interaction could quickly become destructive and the efficacy of the process decreases. In order to achieve effective parametric generation, it is thus necessary to achieve phase tuning which maintains constructive interaction along the entire length of the propagation. The cylindrical geometry of the device 1 makes it possible to achieve phase tuning between the two modes of the microlaser and the THz mode at the difference in frequency. Recent studies, described for example in the document "Whispering-gallery-mode analysis of phase-matched doubly resonant second-harmonic generation" (Y. Dumegie and P. Féron, Phys. Rev. A 74, 063804 (2006)), demonstrate that a clever selection of whispering gallery modes makes it possible to achieve quasi-phase-tuning within a GaAs microcylinder, and to potentially achieve effective nonlinear interaction when the frequency is doubled.

The use of a GaAs-based active layer 7 poses significant advantages linked to this material:
    its very mature technology,
    its high optical index,
    its high nonlinear coefficient.

Whilst the first point makes it possible to produce compact devices at low cost, the high optical confinement and the high nonlinearity can give rise to high conversion rates.

Confinement of the two near-IR whispering gallery modes is ensured by the active layer 7. The cylindrical geometry of the active layer 7 ensures vertical confinement of the near-infrared light ($\lambda$~1 µm) and the reflection over the semiconductor-air interface of this microcylindrical layer 7 gives rise to near-infrared whispering gallery modes. The whispering gallery modes are characterised by their polarisation—transverse electric (TE) or transverse magnetic (TM)—and by three integers that characterise their vertical order (corresponding to the order of the mode following the vertical direction of the cylinder), their radial order (corresponding to the order of the mode following the ray of the cylinder) and their azimuthal order. By contrast the active layer 7 does not enable confinement of the THz mode.

The vertical confinement of the THz mode is ensured by the upper and lower mirrors 3 and 4. These two metal mirrors 3 and 4 form a guide for the THz electromagnetic waves and ensure record vertical confinement of the THz mode in accordance with the principle of plasmonic metal guides for THz waves; confinement of this type is described in the document "Terahertz quantum-cascade laser at $\lambda$=100 µm using metal waveguide for mode confinement" (B. S. Williams et al., Appl. Phys. Lett. 83, 2124 (2003)). This confinement makes it possible to increase the efficacy of the nonlinear conversion rate within the scope of the device 1 according to the invention. It will be noted that the principle of a plasmonic metal guide may also be applied with a single mirror (in this instance the vertical confinement of the THz mode is also of the plasmonic type but with a single mirror permitting optical excitation of the emitters, although the presence of a single mirror leads to a loss in confinement of the THz mode). Reflection over the semiconductor-air interface of the microcylinder 7 leads to the formation of THz whispering gallery modes. The $Al_xGa_{1-x}As$ layers 6 and 8 make it possible move the guided mode further away from the metal mirrors 3 and 4 and to limit optical losses by absorption in the metal. The infrared optical modes confined in the central active GaAs layer have a tendency to 'run' into the $Al_xGa_{1-x}As$ layers 6 and 8. However, if the metal mirrors are too close to the central layer, the infrared optical modes are likely to be absorbed by the metal. The thickness of the $Al_xGa_{1-x}As$ layers 6 and 8 is thus selected so as to minimise losses of the infrared optical modes. The layers 6 and 8 thus act as a spacer between the active layer 7 and the mirrors 3 and 4. As a result of their high index, these layers 6 and 8 also ensure lateral confinement of the THz mode.

The vertical section of the device 1 as shown in FIG. 1c illustrates a semi-insulating zone 14 corresponding to the central portion of the heterostructure 2. This zone 14 is substantially cylindrical (concentric to the cylinder formed by the heterostructure 2). As will be seen later with reference to the description of the production method, this semi-insulating zone 14 may be obtained, for example, by a step of ionic implantation. This zone 14 makes it possible to improve the performance of the device 1 according to the invention since the pumping current is thus effectively channelled in the active zone of the device 1, that is to say the circumference of the active GaAs layer 7 that supports near-infrared whispering gallery modes. The arrows indicate the path of the pumping current within the device 1.

According to the invention, the same semiconductor heterostructure 2 ensures the functions of a pump laser source and frequency conversion. This approach makes it potentially possible to overcome all the problems of optical alignment and significantly simplifies the packaging of the device 1 according to the invention. It results in an extremely compact THz radiation emitting device 1.

It will be noted that it is also possible to reverse the p-doped and n-doped layers (i.e. to move the layers with n-doping to the upper level and the layers with p-doping to the lower level) without departing from the scope of the invention: the electrical contact points will of course have to be adapted to the type of doping.

A purely illustrative example of the sizing of the device 1 according to the invention can be found below: it is known that the spectral separation between whispering gallery modes depends on the effective index of the guided mode and on the diameter of the cylinder. The diameter will thus be selected so as to obtain THz emission within the desired spectral range and so as to achieve phase tuning between the two near-infrared modes and the THz mode. The structure defined by the following parameters will now be considered by way of example:
    thickness of the GaAs active guide layer 7: 325 nm;
    composition and thickness of the optical confinement spacer layers 6 and 8: $Al_{0.6}Ga_{0.4}As$, 2800 µm.
    diameter of the cylindrical heterostructure 2: 42 µm In the example given above, the calculation of the whispering gallery modes of the structure shows that phase tuning is obtained between the near-infrared modes $TE_{0,1,946}$ ($\lambda$=0.917 µm) and $TE_{0,1,948}$ ($\lambda$=0.905 µm), and the THz mode $TM_{0,1,4}$ ($\lambda$=70 µm or 4.3 THz).

Regarding the choice of the emitting medium, it will be noted that whispering-gallery-mode microlasers using one or more quantum wells as an emitter tend to exhibit monomode behaviour for injection currents significantly greater than the threshold current. The broadening of the gain curve of quantum wells is in fact homogeneous by nature, which enables competition between modes above the threshold. In this instance the quantum dots pose a potentially more effective solution since their gain curve naturally exhibits a highly inhomogeneous broadening (60 to 100 meV for InAs dots in GaAs) owing to the size dispersion of quantum dots. Under these conditions, a plurality of whispering gallery modes can be found in the amplification band of the active medium. The homogeneous width of the gain, approximately 10 meV at ambient temperature, is significantly less than its inhomogeneous width, which makes it possible to observe the laser effect for a plurality of whispering gallery modes.

In terms of the performance of the laser device 1 according to the invention, the microcylindrical geometry is larger than that of a microdisc since it enables good evacuation of heat toward the substrate, thus ensuring stability of the power of the properties of the laser and making it possible achieve laser powers compatible with nonlinear THz generation.

The cylindrical geometry of the device 1 according to the invention with emitters inside makes it possible to generate high THz powers within a compact source. This geometry poses the following advantages:

- the cylindrical symmetry of the central GaAs portion promotes phase tuning between the optical modes and the THz mode.
- it makes it possible to simultaneously and independently optimise vertical confinement of the optical whispering gallery modes and of the THz mode by manipulating the thicknesses of the different layers (in particular the AlGaAs optical confinement layers). This makes it possible to maximise the overlap between the optical modes and the THz mode.
- the semi-insulating central zone makes it possible to effectively inject charge carriers at the periphery of the central GaAs layer that supports optical whispering gallery modes.
- the cylindrical geometry enables good evacuation of heat toward the substrate, ensuring stability of the power of the properties of the laser and making it possible to achieve laser powers compatible with nonlinear THz generation.

It will be noted that one of the details of the device according to the invention is to integrate an electrically powered emitting medium as the source of a nonlinear THz process in a microcylinder microcavity. The geometry that uses whispering gallery modes described within the scope of this invention enables this integration. In accordance with the invention the emitting medium is in the microcylinder and it is this integration that leads to a potentially economically viable, compact THz source.

FIGS. 2a to 2f illustrate the different steps of the method for producing the device 1 according to the invention.

Figure 2A:
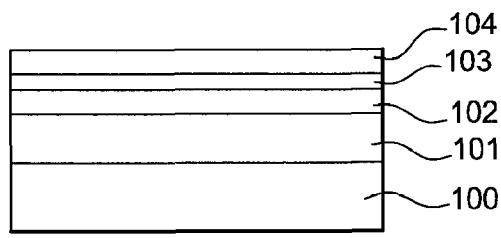
FIGS. 2a to 2f show different steps of a method for producing a device as shown in FIGS. 1a to 1c.

The first step shown on FIG. 2a is constituted by a step of epitaxial growth in order to obtain the different layers of the semiconductor heterostructure. The semiconductor heterostructure is elaborated by a conventional growth technique, such as molecular jet epitaxy (MJE) or metalorganic vapour phase epitaxy (MOVPE). The following are deposited on a GaAs substrate 100 (oriented <100>): a GaAs buffer layer (not shown), typically over a thickness of 0.5 µm (so as to obtain a surface of better quality than the surface of the substrate 100), an AlAs sacrificial layer 101 (0.5 µm) and then the different semiconductor layers as shown in FIG. 1b between the two metal mirrors in accordance with the following sequence:

GaAs-p (not shown)/$Al_xGa_{1-x}$As-p (reference 102)/GaAs-nid (reference 103)/$Al_xGa_{1-x}$As-n (reference 104)/GaAs-n (not shown).

The growth of the GaAs layer 103 not intentionally doped is interrupted one or more times in order to insert the near-infrared emitters (quantum wells or quantum dot designs). The thin n-doped GaAs layer protects the n-doped $Al_xGa_{1-x}$As layer 104 against oxidation.

Figure 2B:
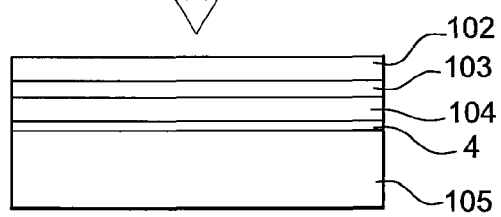

Referring to FIG. 2b, the epitaxiated layer obtained in accordance with the first step is then returned, transferred by adhesion to a host substrate 105 previously metallised by a metallisation layer 4 (said metallisation forming the lower mirror). The host substrate 105 is a substrate that is a good thermal and electrical conductor, for example a metal substrate or a doped GaAs substrate. The initial GaAs substrate 100 is then thinned by mechanical abrasion until a thickness of approximately 50 µm is achieved. The remaining substrate is then eliminated by selective chemical attack using the AlAs sacrificial layer 102 as a stop layer. It will be noted that the GaAs buffer layer is eliminated at the same time as the substrate 100. Lastly, the AlAs sacrificial layer 102 is removed by a new selective chemical attack that releases the surface of the GaAs-p layer (not shown) for further technical steps. Said thin GaAs-p layer protects the underlying p-doped $Al_xGa_{1-x}$As layer 102 against oxidation.

Figure 2C:
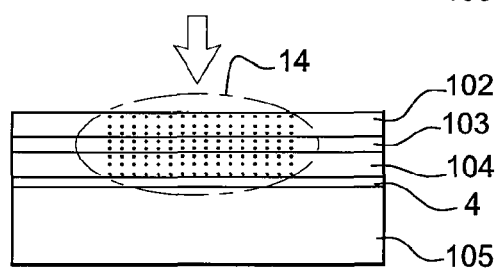

FIG. 2c illustrates the step of suppression of the conductivity of the central portion 14 (corresponding to the semi-insulating central portion of the cylindrical heterostructure). In order to do this, a first level of lithography is carried out that defines in a resin mask an opening with a diameter that is slightly smaller than that of the final cylinder of the cylindrical heterostructure (typically 1 to 2 µm at least). A step of ionic implantation is then carried out that renders the unprotected zone semi-insulating. If necessary, a hard mask that is more robust with regard to ionic implantation may optionally be used. The resin and the optional hard mask are eliminated at the end of this step.

Figure 2D:
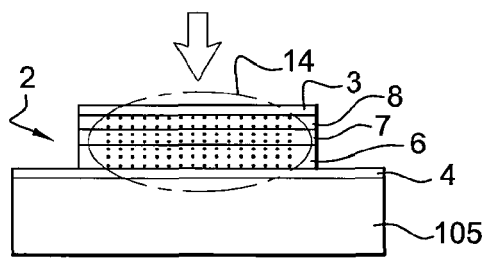

FIG. 2d illustrates the step of deposition of the upper mirror and definition of the cylindrical geometry of the heterostructure. A second level of lithography is used for this which is aligned with the first level and makes it possible to define the circular upper metal mirror 3, which has a diameter equal to the diameter of the cylindrical heterostructure, by a method of the 'lift-off' type. The upper metal mirror 3 is then used directly as an etching mask. This etching mask 3 may optionally be reinforced by the deposition of an additional metal layer, for example made of chromium. The cylindrical geometry is then defined by reactive ionic etching (RIE) using a mixture of chlorinated gases. FIG. 2d shows the cylindrical semiconductor heterostructure 2 comprising, from bottom to top:

- the lower mirror 4;
- the thin n-doped GaAs layer (not shown);
- the n-doped $Al_xGa_{1-x}$As alloy layer 6;
- the active layer 7;
- the p-doped $Al_xGa_{1-x}$As alloy later 8;
- the thin p-doped GaAs layer 9 (not shown);
- the upper mirror 3;
- the semi-insulating central zone 14.

Figure 2E:
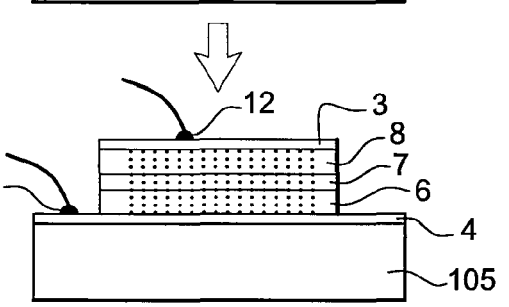

FIG. 2e illustrates the step of contacting the upper mirror 3 forming the upper electrode; this step is carried out directly by microwelding 12 a wire to the upper mirror 3. Contact is made with the lower mirror 4 in the same manner via a microwelding 112. It will be noted that the microwelding may also be carried out on the rear face (directly on the doped metal or semiconductor host substrate), as shown in FIG. 1c.

Figure 2F:
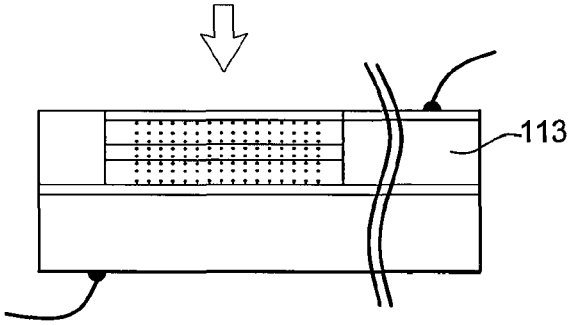

The contacting step may also be carried out in accordance with FIG. 2f which implies an additional step of planarization 113 and deposition of off-centre contact pads (step of additional lithography).

The method of manufacture described above is adapted to the parallel production of a plurality of devices according to the invention, making it possible to produce THz emitting matrices, for applications of high-power THz generation or selective frequency sources called agile frequency sources.

An example of an agile frequency source 200 is shown in FIG. 3. This source 200 comprises a plurality of THz devices according to the invention; in this instance six devices 201 to 206 emitting at different THz frequencies ($f_1$ to $f_6$ respectively) within this network of emitters. The emitters 201 to 206 of different frequencies can be addressed individually (via respective control means 301 to 306) and thus make it possible to form the agile frequency source.

It will be noted that it is also possible to use a plurality of THz emitting devices according to the invention within a network of phase emitters—the benefit of producing networks of emitters is twofold. Firstly, it may be useful to provide a matrix of identical emitters in order to increase the THz power emitted. Phasing of the different emitters may promote this increase. This phasing of the different emitters may be achieved in two different ways:
1) by moving closer together the different THz emitting devices according to the invention by a fraction of a wavelength (a few microns) so as to couple the THz evanescent fields of the different devices.
2) by using an optical device that reinjects some of the THz radiation emitted by the matrix of emitting devices into the matrix itself.

Of course, the device and method according to the invention are not limited to the embodiments described above by way of indication and non-limiting example with reference to FIGS. 1 to 3.

In particular, the cylindrical semiconductor heterostructure could be formed, for example, of another family of III-V or II-VI semiconductor materials. A particularly beneficial system is the InGaAsP/InP system, which is often used to produce microlasers that operate at ambient temperature, as a result of the relatively low efficacy of surface non-radiative recombination mechanisms in this system. For example, a waveguide structure of the InP:n/InGaAsP/InP:p type and InGaAs quantum wells or InAs quantum dots could be used as an emitting medium.

The semiconductor heterostructure could also be modified so as to optimise optical confinement of the near-infrared guided mode or to facilitate electric injection in the structure. The technical solutions developed for conventional laser diodes such as gradual composition confinement layers (GRINSCH structures) could, of course, be implemented in this instance.

In addition, in the embodiment described above, the waveguide is monomode TE and the two near-infrared modes involved in parametric generation are of the $TE_{1,1,m}$ type (as mentioned above, the first two numbers denote the order of the mode in the vertical direction of the cylinder and in the direction of its ray, and m denotes the azimuthal order of the mode). However, the cylinder has other whispering gallery modes of greater radial index that can also be utilised. Furthermore, by increasing the thickness of the central GaAs layer or the aluminium composition of the AlGaAs confinement layers, it is possible to increase the number of guided modes. For a guide having k TE guided modes, the cylinder will have k families of whispering gallery modes of the $\{TE_{h,n,m}\}$ type (with n and m being fixed, and h being an integer between 1 and k). The existence of these families of additional whispering gallery modes widens the choice of possible combinations for achieving phase tuning for THz generation by frequency difference.

As will have been explained already with reference to FIG. 1, it is also possible to use a single metal mirror to confine the THz mode. The other metal layer could be replaced with a doped semiconductor layer that also has THz wave-guiding properties. The benefit of this variant is that it makes it possible to avoid the technical step of transfer of the structure to a further substrate. A doped semiconductor layer is thus inserted during growth (FIG. 2a) and ultimately replaces the metal layer at the bottom of the structure. The step corresponding to FIG. 2b of transfer to a further substrate is omitted and the growth substrate is conserved. The rest of the procedure is identical.

It will also be noted that the device according to the invention described above enables electric pumping of the active medium. This pumping may be carried out optically with a laser. In this instance, the n- and p-doped layers acting as the semiconductor structure for electric injection of carriers and the step of ionic implantation are not necessary. By contrast, the variant described above of substitution of the bottom metal layer with a doped semiconductor layer is particularly beneficial with a doped semiconductor layer transparent to optical pumping. The integration, for example by adhesion, of this device according to the invention at the end of an optical fibre transporting the pump beam makes it possible to obtain a compact, optically pumped THz source. A source of this type at the end of an optical fibre could be used, for example, to form a THz endoscope for medical analysis.

The device according to the invention operates at ambient temperature. However, it is also conceivable to integrate this device into a cryogenic system (in a cryostat or on a cooling base using the Peltier effect). Temperature can be used as an additional control parameter in order to produce and finely adjust phase tuning. In addition, operation at low temperature makes it possible to reduce the homogeneous width of the quantum dots and promotes multimode behaviour of the laser. This may also enable use of larger microcavities and thus of whispering gallery modes that are closer with regard to frequency. By moving the laser frequencies closer together, it is thus possible to obtain weaker THz frequencies. Operation at low temperature may also make it possible to improve the performance of the laser device (reduction of the threshold current, increase in the electro-optical conversion rate).

We have seen that the emitting medium could contain one or more quantum dot designs or one or more quantum wells. It is also possible to use a quantum-cascade gain medium. It is known to the person skilled in the art that quantum cascade lasers also exhibit multimode emission potentials: for example a quantum cascade laser simultaneously emitting at two different wavelengths within the mid-infrared spectrum without mode competition has been demonstrated in the document "Evidence of cascaded emission in a dual-wavelength quantum cascade laser" (K. J. Franz et al., Appl. Phys. Lett. 90, 091104 (2007)). It is thus possible to replace the quantum dots or quantum wells in the invention with quantum cascade structures. The polarisations of the two quantum cascade laser waves are TM. The use of a semiconductor heterostructure having a different crystalline orientation (growth on a face (111) of a GaAs substrate for example) may thus be advantageous in order to optimise the nonlinear coefficient.

Lastly, a distinction is traditionally made between two regimes for parametric generation of light in a cavity, in this instance by frequency difference, depending on whether the mean number of photons in the mode is (or isn't) greater than 1. In the first instance, the system is in the parametric oscillation regime, which is favourable for generating high THz power. These two operating regimes, which may be obtained a priori for the same structure depending on whether it is pumped 'weakly' or 'strongly', are both considered to be in accordance with the invention.

The invention claimed is:
1. A laser device having a wave emission within a frequency range of 0.5 to 5 THz, the device comprising:
   a semiconductor heterostructure arranged over a surface of a substrate, said surface forming a first side of the substrate, said heterostructure having a cylindrical form with a circular cross-section, and comprising
   a first optically nonlinear semiconductor material layer including an emitting-medium configured to emit at least two optical whispering gallery modes belonging to the near-infrared spectrum, the two whispering gallery modes being confined within the first layer and enabling the generation, within the first layer, of radiation within an electromagnetic whispering gallery mode having a frequency of 0.5 to 5 THz, the radiation being obtained through the difference in frequency of the two whispering gallery modes, the cylindrical geometry of said heterostructure ensuring phase tuning between the two optical whispering gallery modes belonging to the near-infrared spectrum and the terahertz mode at the difference in frequency;

a second and a third semiconductor material layer, each having an optical index weaker than the index of the material used for the first layer and located on both sides of the first layer;

a first metal layer arranged at a first end of the heterostructure, and a second metal layer arranged at a second end, opposite said first end, of the heterostructure and between said surface of the substrate and said first metal layer, the first and second metal layers arranged to confine said terahertz mode;

a first electrical contact provided on said first metal layer for injection of a pumping current of said emitting medium, and a second electrical contact provided on a second side, opposite said first side, of the substrate.

2. The device according to claim 1, wherein, said cylindrical heterostructure comprises a central semi-insulating zone extending substantially between the first and second ends of said heterostructure.

3. The device according to claim 1, wherein at least one of said first and second metal layers is made of gold.

4. The device according to claim 1, wherein said emitting medium is produced in one of the following forms:
a quantum well or a plurality of quantum wells;
a design or a plurality of designs of quantum dots;
a quantum cascade structure or a plurality of quantum cascade structures.

5. The device according to claim 1, wherein said optically nonlinear semiconductor material of said first layer is a III-V material or a II-VI material.

6. The device according to claim 1, wherein the semiconductor material of said second and third layers is $Al_xGa_{1-x}As$ with $0.2<x<0.6$ or InP.

7. The device according to claim 1, wherein said second semiconductor layer is a p-doped layer and said third semiconductor layer is a n-doped layer.

8. The device according to claim 1, wherein said first layer includes a plurality of emitters.

9. The device according to claim 1, wherein said cylindrical heterostructure comprises two semiconductor protective layers protecting against oxidation covering said second and third layers respectively.

10. The device according to claim 9, wherein, each of said protective layers protecting against oxidation has a thickness between 2 and 10 nm.

11. The device according to claim 1, wherein the thickness of said second and third layers is between 0.5 and 5 μm.

12. The device according to claim 1, wherein the thickness of said first layer is between 200 and 400 nm.

13. The device according to claim 1, wherein the diameter of said cylindrical heterostructure is between 30 and 100 μm.

14. The device according to claim 1, wherein said first layer is a layer that is not intentionally doped.

15. A cryogenic system integrating a device according to claim 1.

16. A network comprising a plurality of devices according to claim 1, wherein each of said devices has substantially the same frequency.

17. The network according to claim 16, wherein said devices are sufficiently close to one another to couple the THz evanescent fields of the different devices.

18. The network according to claim 16, wherein some of the THz radiation emitted by said network is reinjected into said network.

19. A network comprising a plurality of devices according to claim 1, wherein each of said devices has different THz frequencies, each of said devices being controlled individually.

20. A method for producing a device according to claim 1, the method comprising:
epitaxially growing, by deposition on a semiconductor substrate, a structure comprising at least the following layers in the following order from the substrate:
a sacrificial semiconductor layer;
a first protective semiconductor layer;
a layer formed of a semiconductor material identical to that of said second layer;
a layer formed of a semiconductor material identical to that of said first layer, said layer comprising an emitting medium;
a layer formed of a semiconductor material identical to that of said third layer;
a second protective semiconductor layer;
transferring to a previously metalized host substrate said epitaxiated structure in such a way that the second protective layer is in contact with the metal of said host substrate;
thinning said semiconductor substrate by mechanical abrasion;
selectively chemically attacking said substrate over the remaining thickness, said sacrificial layer being used as a stop layer;
selectively chemically attacking said sacrificial layer, said first protective layer being used as a stop layer;
providing a mask defining an opening with a diameter smaller than the diameter of the cylindrical heterostructure;
performing a ionic implantation to render the zone not protected by said mask semi-insulating;
eliminating said mask;
depositing a circular metal layer with a diameter equal to the diameter of the cylindrical heterostructure;
etching the portions not covered by said circular metal layer so as to form the cylindrical hetero structure.

21. The method according to claim 20, wherein, said mask defines an opening with a diameter smaller than the diameter of the cylindrical heterostructure by 1 to 2 μm.

22. The device according to claim 5, wherein the III-V material is GaAs or InGaAsP.

23. The device according to claim 1, wherein the heterostructure has a disk-shaped cross-section.

24. The device according to claim 2, wherein said first metal layer is provided over said central semi-insulating zone and said central semi-insulating zone is provided over said second metal layer.

* * * * *